United States Patent
Wang et al.

(10) Patent No.: US 10,126,339 B2
(45) Date of Patent: Nov. 13, 2018

(54) METHODS AND DEVICES FOR SWITCHING FILTERS AND MEDICAL APPARATUSES USING THE SAME

(71) Applicant: SHENZHEN MINDRAY BIO-MEDICAL ELECTRONICS CO., LTD., Shenzhen (CN)

(72) Inventors: Pei Wang, Shenzhen (CN); Wenyu Ye, Shenzhen (CN); Shen Luo, Shenzhen (CN)

(73) Assignee: Shenzhen Mindray Bio-Medical Electronics Co., Ltd., Shenzhen (CN)

( * ) Notice: Subject to any disclaimer, the term of this patent is extended or adjusted under 35 U.S.C. 154(b) by 329 days.

(21) Appl. No.: 14/822,588

(22) Filed: Aug. 10, 2015

(65) Prior Publication Data

US 2016/0344371 A1    Nov. 24, 2016

(30) Foreign Application Priority Data

May 22, 2015  (CN) .......................... 2015 1 0267249

(51) Int. Cl.
| | |
|---|---|
| *H03H 17/04* | (2006.01) |
| *G01R 23/165* | (2006.01) |
| *H03H 17/02* | (2006.01) |

(52) U.S. Cl.
CPC ....... *G01R 23/165* (2013.01); *H03H 17/0294* (2013.01); *H03H 17/04* (2013.01); *H03H 2017/0295* (2013.01); *H03H 2017/0477* (2013.01)

(58) Field of Classification Search
CPC .. G01R 23/165; H03H 17/0294; H03H 17/04; H03H 2017/0295; H03H 2017/0477
USPC ........................................................... 702/75
See application file for complete search history.

(56) References Cited

U.S. PATENT DOCUMENTS

| | | | | |
|---|---|---|---|---|
| 5,157,623 | A * | 10/1992 | Hayashi | ................. G06F 17/17 708/313 |
| 9,324,348 | B2 * | 4/2016 | Blinick | ............ G11B 20/10009 |
| 2014/0142395 | A1 * | 5/2014 | Sattler | .................. A61B 5/7203 600/300 |
| 2014/0240605 | A1 * | 8/2014 | Basawapatna | ....... G01R 23/165 348/725 |

* cited by examiner

*Primary Examiner* — Fernando Hidalgo
(74) *Attorney, Agent, or Firm* — Polsinelli LLP; Kory D. Christensen

(57) ABSTRACT

Methods and devices for switching filters and medical apparatuses using the same are described. The method includes: detecting whether or not a frequency range of an input signal is changed from a first frequency range into a second frequency range; if changed, switching from a first filter to a second filter, and taking a sample value of the input signal at a current moment as an input value of the second filter at the current moment and sample values of the input signal at n moments before the current moment as input values of the second filter at the n moments, respectively, and taking output values of the first filter at m moments before the current moment as output values of the second filter at the m moments, to obtain an output value of the second filter at the current moment.

12 Claims, 4 Drawing Sheets

METHODS AND DEVICES FOR SWITCHING FILTERS AND MEDICAL APPARATUSES USING THE SAME

FIELD

The disclosure relates to the field of signal processing and, more particularly, to methods and devices for switching filters and medical apparatuses using the same.

BACKGROUND

A filter is a common device in the field of signal processing, through which signals within a particular frequency range can be passed, while other signals outside the particular frequency range will be blocked. However, in fact, the frequency range that is allowed to pass through a corresponding filter is fixed, that is, each filter corresponds to a fixed frequency range, and if the frequency ranges of an input signal are not fixed, that is, the input signal includes a plurality of frequency ranges, it may need more than one filter to serve for the input signal. When the frequency ranges of the input signal are changed, that is, when the frequency range of the input signal is changed from one to another, it needs to switch the filter from one to another correspondingly. Referring to FIG. 1, it is assumed that a desired output signal would be an output signal as shown in FIG. 1 after an input signal is filtered by two filters. However, due to an effect of switching instant, an output value of the filter at the switching instant and output values of the filter before and after the switching instant are discrete, which may lead to distortion of the output signal. Thus, the actual output signal may be the distorted output signal after the switching as shown in FIG. 1.

SUMMARY

Embodiments of the current disclosure provide methods and devices for switching filters and medical apparatuses using the same, which can be directed to reduce the distortion of an output signal resulting from the switching of the filter.

According to a first aspect of the current disclosure, it is provided a method for switching filters, including: detecting whether or not a frequency range of an input signal is changed from a first frequency range into a second frequency range, wherein the first frequency range is a frequency range within which a first filter is able to work, and the second frequency range is a frequency range within which a second filter is able to work; if changed, switching from the first filter to the second filter, and taking a sample value of the input signal at a current moment as an input value of the second filter at the current moment and sample values of the input signal at n moments before the current moment as input values of the second filter at the n moments, respectively, and taking output values of the first filter at m moments before the current moment as output values of the second filter at the m moments, to obtain an output value of the second filter at the current moment, wherein n and m are both positive integers.

Wherein, the step of taking a sample value of the input signal at a current moment as an input value of the second filter at the current moment and sample values of the input signal at n moments before the current moment as input values of the second filter at the n moments, respectively, and taking output values of the first filter at m moments before the current moment as output values of the second filter at the m moments, to obtain an output value of the second filter at the current moment comprises: setting the sample value of the input signal received by the second filter at the current moment and the sample values of the input signal received by the second filter at the n moments before the current moment as $(X_0, X_1, \ldots, X_n)$, magnifying the sample values $(X_0, X_1, \ldots, X_n)$ according to each corresponding magnification factor $(c_0, c_1, \ldots, c_n)$ of the second filter, and summing the magnified sample values to obtain a first sum value $S_x$; then setting the output values of the second filter at the m moments before the current moment as output values $(Y_1, \ldots, Y_m)$ of the first filter at the m moments, magnifying the output values $(Y_1, \ldots, Y_m)$ according to each corresponding magnification factor $(d_1, \ldots, d_m)$ of the second filter, and summing the magnified output values $(Y_1, \ldots, Y_m)$ to obtain a second sum value $S_y$; and adding the first sum value $S_x$ and the second sum value $S_y$ to obtain the output value $Y=S_x+S_y$ of the second filter at the current moment.

Wherein, before the step of magnifying the sample values $(X_0, X_1, \ldots, X_n)$ according to each corresponding magnification factor $(c_0, c_1, \ldots, c_n)$ of the second filter, and summing the magnified sample values to obtain a first sum value $S_x$, the method further comprising: setting part or all of $X_1, \ldots, X_n$ to equal to a first specified value, wherein the first specified value is any one of $X_1, \ldots, X_n$, or the first specified value is an average value of $(X_0, X_1, \ldots, X_n)$ or a weighted value of $X_1, \ldots, X_n$.

Wherein, before the step of magnifying the output values $(Y_1, \ldots, Y_m)$ according to each corresponding magnification factor $(d_1, \ldots, d_m)$ of the second filter, and summing the magnified output values $(Y_1, \ldots, Y_m)$ to obtain a second sum value $S_y$, the method further comprising: setting part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

According to a second aspect of the current disclosure, it is provided a device for switching filters, including: a detecting component, a switching component and an output value obtaining component; the detecting component, which is configured to detect whether or not a frequency range of an input signal is changed from a first frequency range into a second frequency range, wherein the first frequency range is a frequency range within which a first filter is able to work, and the second frequency range is a frequency range within which a second filter is able to work; the switching component, which is configured to switch from the first filter to the second filter when the frequency range of the input signal is changed from the first frequency range into the second frequency range; the output value obtaining component, which is configured to take a sample value of the input signal at a current moment as an input value of the second filter at the current moment and sample values of the input signal at n moments before the current moment as input values of the second filter at the n moments, respectively, and take output values of the first filter at m moments before the current moment as output values of the second filter at the m moments, to obtain an output value of the second filter at the current moment, wherein n and m are both positive integers.

Wherein, the output value obtaining component is configured to set the sample value of the input signal received by the second filter at the current moment and the sample values of the input signal received by the second filter at the n moments before the current moment as sample values $(X_0, X_1, \ldots, X_n)$, magnifying the sample values $(X_0, X_1, \ldots,$ $X_n$) according to each corresponding magnification factor ($c_0, c_1, \ldots, c_n$), of the second filter, and summing the magnified sample values to obtain a first sum value $S_x$; then setting the output values of the second filter at the m moments before the current moment as output values ($Y_1, \ldots, Y_m$) of the first filter at the m moments, magnifying the output values ($Y_1, \ldots, Y_m$) according to each corresponding magnification factor ($d_1, \ldots, d_m$) of the second filter, and summing the magnified output values to obtain a second sum value $S_y$; and adding the first sum value $S_x$ and the second sum value $S_y$ to obtain the output value $Y=S_x+S_y$ of the second filter at the current moment.

Wherein, the device further includes a first value setting component, the first value setting component is configured to set part or all of $X_1, \ldots, X_n$ to equal to a first specified value, wherein the first specified value is any one of $X_1, \ldots, X_n$, or the first specified value is an average value of $X_1, \ldots, X_n$ or a weighted value of $X_1, \ldots, X_n$.

Wherein, the device further includes a second value setting component, the second value setting component is configured to set part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

According to a third aspect of the current disclosure, it is provided a medical detecting apparatus, including: a detecting component, a switching component and an output value obtaining component; the detecting component, which is configured to detect whether or not a frequency range of an input signal is changed from a first frequency range into a second frequency range, wherein the first frequency range is a frequency range within which a first filter is able to work, and the second frequency range is a frequency range within which a second filter is able to work; the switching component, which is configured to switch from the first filter to the second filter when the frequency range of the input signal is changed from the first frequency range into the second frequency range; the output value obtaining component, which is configured to take a sample value of the input signal at a current moment as an input value of the second filter at the current moment and sample values of the input signal at n moments before the current moment as input values of the second filter at the n moments, respectively, and take output values of the first filter at m moments before the current moment as output values of the second filter at the m moments, to obtain an output value of the second filter at the current moment, wherein n and m are both positive integers.

Wherein, the output value obtaining component is configured to set the sample value of the input signal received by the second filter at the current moment and the sample values of the input signal received by the second filter at the n moments before the current moment as sample values ($X_0, X_1, \ldots, X_n$), magnifying the sample values ($X_0, X_1, \ldots, X_n$) according to each corresponding magnification factor ($c_0, c_1, \ldots, c_n$) of the second filter, and summing the magnified sample values to obtain a first sum value $S_x$; then setting the output values of the second filter at the m moments before the current moment as output values ($Y_1, \ldots, Y_m$) of the first filter at the m moments, magnifying the output values ($Y_1, \ldots, Y_m$) according to each corresponding magnification factor ($d_1, \ldots, d_m$) of the second filter, and summing the magnified output values to obtain a second sum value $S_y$; and adding the first sum value $S_x$ and the second sum value $S_y$ to obtain the output value $Y'=S_x+S_y$ of the second filter at the current moment.

Wherein, the medical detecting apparatus further includes a first value setting component, the first value setting component is configured to set part or all of $X_1, \ldots, X_n$ to equal to a first specified value, wherein the first specified value is any one of $X_1, \ldots, X_n$, or the first specified value is an average value of $X_1, \ldots, X_n$ or a weighted value of $X_1, \ldots, X_n$.

Wherein, the medical detecting apparatus further includes a second value setting component, the second value setting component is configured to set part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

According to the embodiments of the current disclosure, it can be detected whether or not the frequency range of the input signal is changed from the first frequency range into the second frequency range. If changed, it can switch from the first filter to the second filter, a sample value of the input signal at a current moment can be taken as an input value of the second filter at the current moment and sample values of the input signal at n moments before the current moment can be taken as input values of the second filter at the n moments, respectively, and output values of the first filter at m moments before the current moment can be taken as output values of the second filter at the m moments, to obtain an output value of the second filter at the current moment. Thus, the sudden change of the output values caused by the filter switching could be avoided.

BRIEF DESCRIPTION OF THE DRAWINGS

In order to illustrate the embodiments of the disclosure or existing technical solutions more clearly, a brief description of drawings that assists the description of embodiments of the disclosure or existing art will be provided below. It would be apparent that the drawings in the following description are only for some of the embodiments of the disclosure. A person having ordinary skill in the art will be able to obtain other drawings on the basis of these drawings without paying any creative work.

DETAILED DESCRIPTION OF ILLUSTRATED EMBODIMENTS

The following, in conjunction with the accompanying drawings according to various embodiments, clearly describes technical proposals according to various embodiments. It would be obvious that the described embodiments are part but not all of embodiments. All other embodiments obtained by persons having ordinary skill without paying any creative work based on the illustrated embodiments should all be within the protection scope according to various embodiments.

Figure 1:
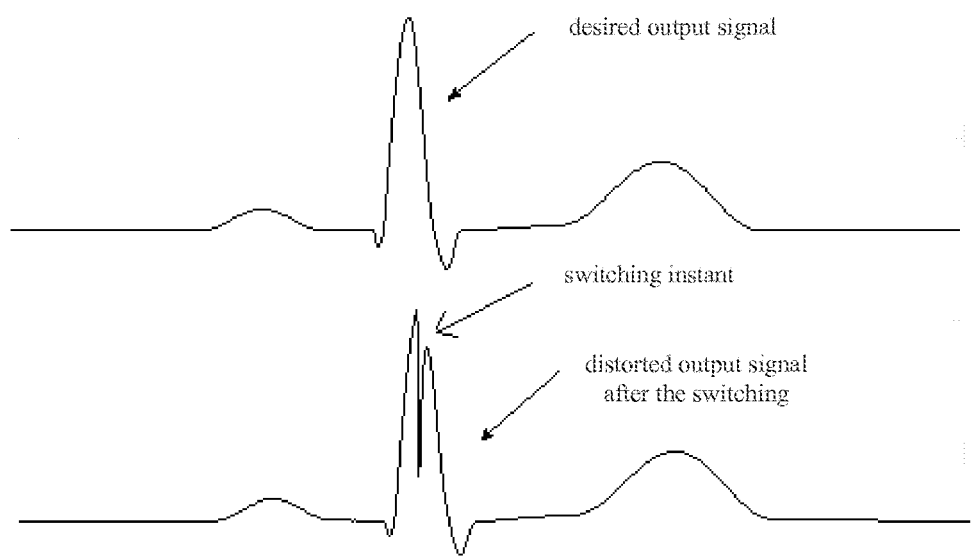
FIG. 1 is a comparison chart of a desired output signal and a distorted output signal caused by switching of filters according to a prior art.
Figure 2:
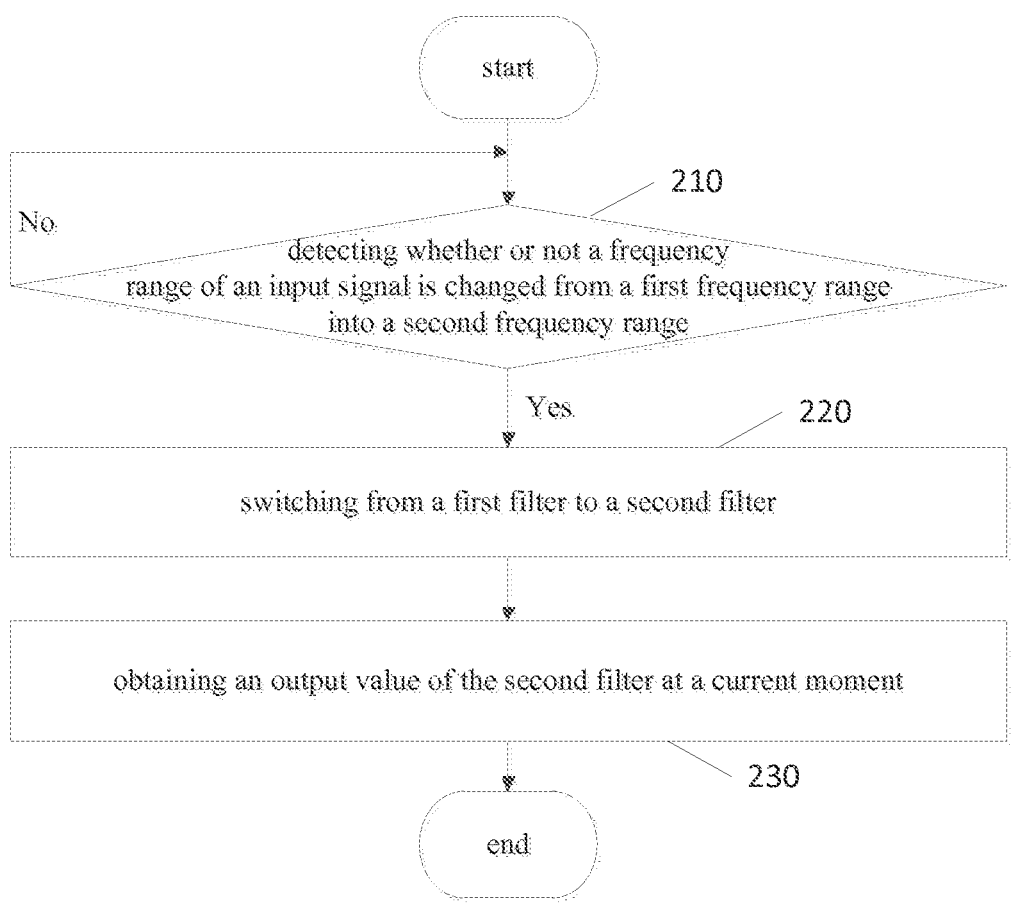
FIG. 2 is a flowchart of a method for switching filters according to one embodiment of the current disclosure.

Referring to FIG. 2, it is a flowchart of a method for switching filters according to one embodiment of the current disclosure. The method for switching filters according to the current disclosure includes steps as follows.

Step 210: detecting whether or not a frequency range of an input signal is changed from a first frequency range into a second frequency range.

Figure 3:
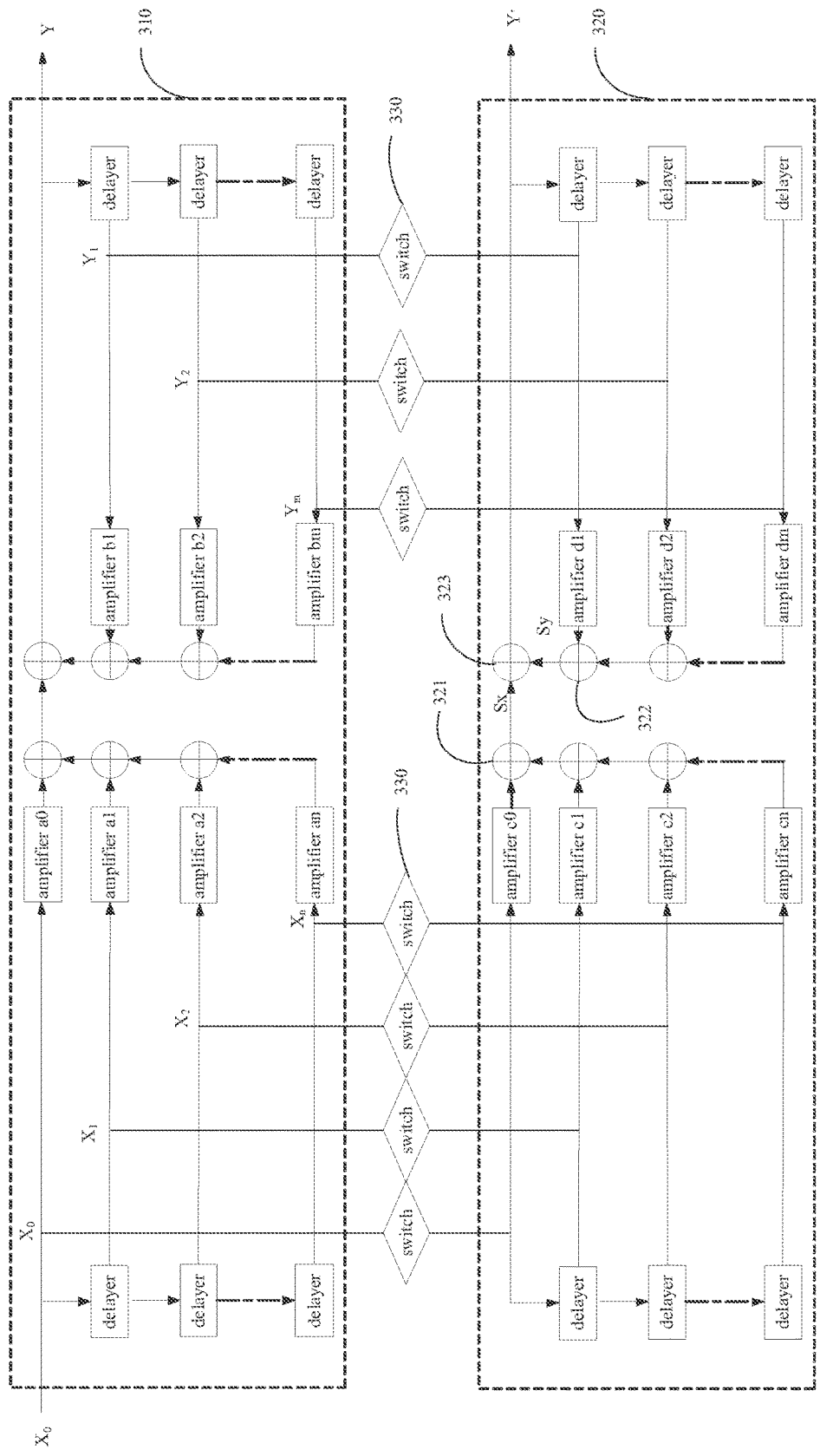
FIG. 3 is a structure diagram of a device for switching filters to implement the method for switching filters as shown in FIG. 2 according to one embodiment of the current disclosure.

Referring to FIG. 3 together, at a current moment, if it is detected that the frequency range of the input signal is changed from the first frequency range into the second frequency range, a first filter 310 is no longer applicable while a second filter 320 is applicable to work. Therefore, the filters may be switched by a switch 330 such that the first filter 310 stops working and the second filter 320 enters a working state. If the frequency range of the input signal is not changed from the first frequency range into the second frequency range, the method returns to the step 210; if the frequency range of the input signal is changed from the first frequency range into the second frequency range, the method enters step 220. Where, the first frequency range is a frequency range within which the first filter 310 is able to work, and the second frequency range is a frequency range within which the second filter 320 is able to work.

Step 220: switching from the first filter 310 to the second filter 320.

Step 230: taking a sample value of the input signal at a current moment as an input value of the second filter 320 at the current moment and sample values of the input signal at n moments before the current moment as input values of the second filter 320 at said n moments, and taking output values of the first filter 310 at m moments before the current moment as output values of the second filter 320 at said m moments, to obtain an output value of the second filter 320 at the current moment. Specifically, the sample value of the input signal received by the second filter 320 at the current moment can be set as a sample value $X_0$, and the sample values of the input signal received by the second filter 320 at n moments before the current moment can be set as sample values $(X_1, \ldots, X_n)$, respectively. After the sample values and $X_0$ and $(X_1, \ldots, X_n)$ are magnified according to each corresponding magnification factor $(c_0, c_1, \ldots, c_n)$ of the second filter 320, the magnified sample values may be summed to obtain a first sum value $S_x$. The output values of the second filter 320 at m moments before the current moment can be set as output values $(Y_1, \ldots, Y_m)$ of the first filter 310 at said m moments, respectively.

After the output values $(Y_1, \ldots, Y_m)$ are magnified according to each corresponding magnification factor $(d_1, \ldots, d_m)$ of the second filter 320, the magnified output values may be summed to obtain a second sum value $S_y$. Then the first sum value $S_x$ and the second sum value $S_y$ may be added to obtain the output value $Y=S_x+S_y$ of the second filter 320 at the current moment.

More specifically, as shown in FIG. 3, sampled values may be input to the first filter 310 in the order of $X_n, \ldots, X_1, X_0$ through an input end of the first filter 310. At the n-th moment before the current moment, a sampled value $X_n$ may be pushed to a delayer in a delay-amplifier branch of a first input end after input to the first filter 310; at the (n−1)th moment before the current moment, after the sampled value $X_{n-1}$ is input to the first filter 310, the sampled value $X_n$ may be pushed to a delayer at a delay-amplifier branch of a second input end, while the sampled value $X_{n-1}$ may be pushed to a delayer at a delay-amplifier branch of the first input end; and so on, until, at the current moment, the sampled signal $X_n$ may be pushed to a delayer at a delay-amplifier branch of an n-th input end, . . . , the sampled value $X_1$ may be pushed to the delayer at the delay-amplifier branch of the first input end.

At the current moment, the switch 330 can be activated, so that the sampled value $X_0$ in an input branch of the first filter 310 can be input to an amplifier with a magnification factor of $c_0$ in an input branch of the second filter 320 to obtain an amplified signal $c_0X_0$, and the sampled value $X_1$ of the delayer at the delay-amplifier branch of the first input end of the first filter 310 can be input to an amplifier with a magnification factor of $c_1$ in the delay-amplifier branch of the first input end of the second filter 320 to obtain an amplified signal $c_1X_1$, . . . , and the like, the sampled value $X_n$ of the delayer at the delay-amplifier branch of the n-th input end of the first filter 310 can be input to an amplifier with a magnification factor of $c_n$ in the delay-amplifier branch of the n-th input end of the second filter 320 to obtain an amplified signal $c_nX_n$.

The amplified signal $c_0X_0$, in the input branch of the second filter 320 and all the amplified signals in the delay-amplifier branches from the first to the n-th input end may be input to an adder 321, and be added by the adder 321 to obtain a first sum value $S_x$, where the first sum value is: $S_x=c_0X_0+c_1X_1+ \ldots +c_nX_n$.

At output ends of the first filter 310, output signals may be output from the first filter 310 in the order of $Y_m, \ldots, Y_1$. At the m-th moment before the current moment, at the same time as that an output signal $Y_m$ is output from the first filter 310, the output signal $Y_m$ may be pushed to a delayer at a delay-amplifier branch of a first output end; at the (m−1)th moment before the current moment, the output signal $Y_{m-1}$ may be output from the first filter 310, in the meantime, the output signal $Y_m$ may be pushed to a delayer at a delay-amplifier branch of a second output end, while the output signal $Y_{m-1}$ may be pushed to a delayer at a delay-amplifier branch of the first output end; and so on, until, at the current moment, the output signal $Y_1$ may be pushed to a delayer at a delay-amplifier branch of the first output end, . . . , the output signal $Y_m$ may be pushed to a delayer at a delay-amplifier branch of an m-th output end.

At the current moment, the switch 330 can be activated, so that the output value $Y_1$ for the delayer at the delay-amplifier branch of the first output end of the first filter 310 can be input to an amplifier with a magnification factor $d_1$ in the delay-amplifier branch of the first output end of the second filter 320, thus obtaining an amplified signal $d_1Y_1$, and the output value $Y_2$ of the delayer at the delay-amplifier branch of the second output end of the first filter 310 can be input to an amplifier with a magnification factor $d_2$ of the second filter 320, thus obtaining an amplified signal $d_2Y_2$; . . . ; the output value $Y_m$ of the delayer at the delay-amplifier branch of the m-th output end of the first filter 310 can be input to an amplifier with a magnification factor $d_m$ of the second filter 320, thus obtaining an amplified signal $d_mY_m$.

The amplified signals in the delay-amplifier branches from the first to the m-th output end may be input to the adder 321, and then be added by the adder 321 to obtain a second sum value $S_y$, where the second sum value is $S_y=d_1Y_1+\ldots+d_mY_m$. The first sum value $S_x$, and the second sum value $S_y$ may be summed to obtain the output value $Y=(c_0X_0+c_1X_1+ \ldots +c_nX_n)+(d_1Y_1+ \ldots +d_mY_m)$ of the second filter 320 at the current moment.

It should be understood that the structures of the first filter 310 and the second filter 320 described-above are just one embodiment of the current disclosure, and that in other embodiments, the first filter 310 and the second filter 320 may also include other structures, which will not be restricted here in embodiments of the current disclosure.

According to the embodiments of the current disclosure, at the moments after switching the filters, the sample value of the input signal received by the second filter 320 at the current moment can be set as a sample value $X_0$, and the sample values of the input signal received by the second filter 320 at n moments before the current moment can be set as sample values $(X_1, \ldots, X_n)$, respectively. After the sample values $X_0$ and $(X_1, \ldots, X_n)$ are magnified according to each corresponding magnification factor $(c_0, c_1, \ldots, c_n)$ of the second filter 320, the magnified sample values may be summed to obtain a first sum value. The output values of the second filter 320 at m moments before the current moment can be set as output values $(Y_1, \ldots, Y_m)$ of the first filter at said m moments, respectively. After the output values $(Y_1, \ldots, Y_m)$ are magnified according to each corresponding magnification factor $(d_1, \ldots, d_m)$ of the second filter 320, the magnified output values may be summed to obtain a second sum value $S_y$. Then the first sum value $S_x$ and the second sum value $S_y$ may be added to obtain the output value of the $Y=(c_0 X_0+c_1 X_1+ \ldots +c_n X_n)+(d_1 Y_1+ \ldots +d_m Y_m)$ of the second filter 320 at the current moment. Thus, the sudden change of the output values caused by the filter switching could be avoided.

It should be understood that, in other embodiments, the sample value $X_0$ at the current moment and the sample values $(X_1, \ldots, X_n)$ of the input signal at the n moments before the current moment can be set to be a first specified value, as input values of the second filter 320, where, the first specified value is any one of $X_1, \ldots, X_n$). For example, the first specified value can be set to be $X_1$, after the first specified value is magnified according to each corresponding magnification factor $(c_0, c_1, \ldots, c_n)$ of the second filter 320, the magnified sample values may be summed to obtain a first sum value $S_x=c_0 X_1+c_1 X_1+ \ldots +c_n X_1$. Additionally, the output values $(Y_1, \ldots, Y_m)$ of the first filter 310 at the in moments before the current moment can be set to be a second specified value, as output values of the second filter 320 at the m moments, where, the second specified value is any one of $Y_1, \ldots, Y_m$. For example, the second specified value can be set to be $Y_m$, after the second specified value is magnified according to each corresponding magnification factor $(d_1, \ldots, d_m)$ of the second filter 320, the magnified output values may be summed to obtain a second sum value $S_y=d_1 Y_m+ \ldots +d_m Y_m$. Finally, the first sum value $S_x$ and the second sum value $S_y$ can be added to obtain an output value $Y=(c_0 X_0=c_1 X_1+ \ldots +c_n Y_n)+(d_1 Y_1+ \ldots +d_m Y_m)$ of the second filter 320 at the current moment.

In other embodiments, it should be understood that part of the sample values $(X_0, X_1, \ldots, X_n)$ can be set to equal to the first specified value, and the others to remain unchanged; furthermore, part of the output values $(Y_1, \ldots, Y_m)$ can be set to equal to the second specified value, and the others to remain unchanged. Or, the first specified value can be set to equal to an average value of $(X_0, X_1, \ldots, X_n)$ or a weighted value of $(X_0, X_1, \ldots, X_n)$. Accordingly, the second specified value can be set to equal to an average value or a weighted value of $(Y_1, \ldots, Y_m)$.

Figure 4:
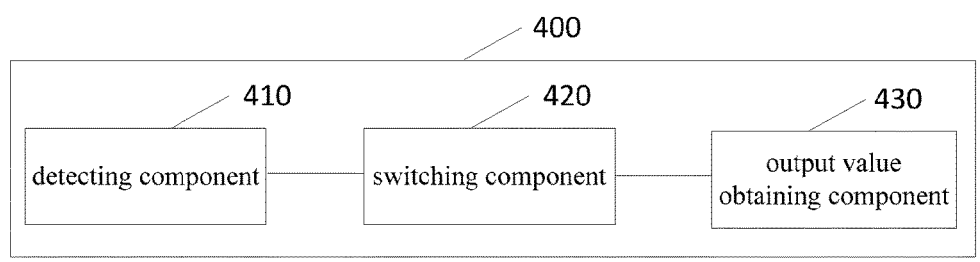
FIG. 4 is a structure diagram of a device for switching filters according to another embodiment of the current disclosure.

Referring to FIG. 4, it is a structure diagram of a device for switching filters disclosed by one embodiment of the current disclosure. The device for switching filters 400 disclosed by the embodiment includes: a detecting component 410, a switching component 420, and an output value obtaining component 430.

The detecting component 410 may be configured to detect whether or not a frequency range of an input signal is changed from a first frequency range into a second frequency range, wherein the first frequency range is a frequency range within which a first filter is able to work, and the second frequency range is a frequency range within which a second filter is able to work.

The switching component 420 may be configured to switch from the first filter to the second filter when the frequency range of the input signal is changed from the first frequency range into the second frequency range.

The output value obtaining component 430 may be configured to take a sample value of the input signal at a current moment as an input value of the second filter at the current moment and sample values of the input signal at n moments before the current moment as input values of the second filter at the n moments, respectively, and take output values of the first filter at m moments before the current moment as output values of the second filter at the m moments, to obtain an output value of the second filter at the current moment, wherein n and m are both positive integers.

In an optional embodiment, the output value obtaining component 430 may be configured to set the sample value of the input signal received by the second filter at the current moment and the sample values of the input signal received by the second filter at the n moments before the current moment as sample values $(X_0, X_1, \ldots, X_n)$ magnifying the sample values $(X_0, X_1, \ldots, X_n)$ according to each corresponding magnification factor $(c_0, c_1, \ldots, c_n)$ of the second filter, and summing the magnified sample values to obtain a first sum value $S_x$; then set the output values of the second filter at the m moments before the current moment as output values $(Y_1, \ldots, Y_m)$ of the first filter at the m moments, magnifying the output values $(Y_1, \ldots, Y_m)$ according to each corresponding magnification factor $(d_1, \ldots, d_m)$ of the second filter, and summing the magnified output values to obtain a second sum value $S_y$; and add the first sum value $S_x$ and the second sum value $S_y$ to obtain the output value $Y=S_x+S_y$ of the second filter at the current moment.

In an optional embodiment, the device for switching filters 400 further includes a first value setting component, the first value setting component may be configured to set all of $X_1, \ldots, X_n$ to equal to a first specified value, where, the first specified value is any one of $X_1, \ldots, X_n$.

In an optional embodiment, the device for switching filters 400 further includes a second value setting component, the second value setting component may be configured to set all of $Y_1, \ldots, Y_m$ to equal to a second specified value, where, the second specified value is any one of $Y_1, \ldots, Y_m$. The steps of the method for switching filters can be implemented in the device for switching filters 400, which can refer to FIG. 2 and a related description, and will not be repeated here in embodiments of the current disclosure.

A medical detecting apparatus is further provided in one embodiment of the current disclosure, wherein, the medical detecting apparatus includes the device for switching filters 400 as described above.

A person having ordinary skill in the art can realize that part or whole of the processes in the methods according to the above embodiments may be implemented by a computer program instructing relevant hardware. The program may be stored in a computer readable storage medium. When executed, the program may execute processes in the above-mentioned embodiments of methods. The storage medium may be a magnetic disk, an optical disk, a Read-Only Memory (ROM), a Random Access Memory (RAM), et al.

The foregoing descriptions are merely embodiments of the current disclosure but not intended to limit the protection scope of the current disclosure. Any variation or replacement made by persons of ordinary skill in the art without departing from the spirit of the current disclosure shall fall within the protection scope of the current disclosure. Therefore, the scope of the current disclosure shall be subject to be appended claims.

What is claimed is:

1. A method for switching filters, comprising:
   detecting, at a detecting component, that a frequency range of an input signal is changed from a first frequency range into a second frequency range, wherein the first frequency range is a frequency range within which a first filter is able to work, and the second frequency range is a frequency range within which a second filter is able to work; and
   switching, via one or more switches, from the first filter to the second filter comprising:
   pushing a sample value of the input signal at a current moment and sample values of the input signal at n moments before the current moment to the first filter in an order of n moments before the current moment and at the current moment;
   pushing the sample value of the input signal at the current moment and the sample values of the input signal at the n moments before the current moment to one or more delayers in n input branches of the first filter;
   activating, upon detection that the frequency range of the input signal is changed from the first frequency range into the second frequency range, the one or more switches at the current moment to push the sample values of the input signal at the n moments before the current moment and the sample value of the input signal at the current moment from the one or more delayers in the n input branches of the first filter to n delay-amplifier branches of the second filter; and
   taking output values of the first filter at m moments before the current moment as output values of the second filter at the m moments, to obtain an output value of the second filter at the current moment using the output values of first filter at the m moments, the sample value of the input signal at the current moment, and the sample values of the input signal at the n moments, wherein n and m are both positive integers.

2. The method according to claim 1, wherein, the step of taking a sample value of the input signal at a current moment as an input value of the second filter at the current moment and sample values of the input signal at n moments before the current moment as input values of the second filter at the n moments, respectively, and taking output values of the first filter at m moments before the current moment as output values of the second filter at the m moments, to obtain an output value of the second filter at the current moment comprises:
   setting the sample value of the input signal received by the second filter at the current moment and the sample values of the input signal received by the second filter at the n moments before the current moment as $(X_0, X_1, \ldots, X_n)$, magnifying the sample values $(X_0, X_1, \ldots, X_n)$ according to each corresponding magnification factor $(c_0, c_1, \ldots, c_n)$ of the second filter, and summing the magnified sample values to obtain a first sum value $S_x$; then setting the output values of the second filter at the m moments before the current moment as output values $(Y_1, \ldots, Y_m)$ of the first filter at the m moments, magnifying the output values $(Y_1, \ldots, Y_m)$ according to each corresponding magnification factor $(d_1, \ldots, d_m)$ of the second filter, and summing the magnified output values $(Y_1, \ldots, Y_m)$ to obtain a second sum value $S_y$; and
   adding the first sum value $S_x$ and the second sum value $S_y$ to obtain the output value $Y'=S_x+S_y$ of the second filter at the current moment.

3. The method according to claim 2, before the step of magnifying the sample values $(X_0, X_1, \ldots, X_n)$ according to each corresponding magnification factor $(c_0, c_1, \ldots, c_n)$ of the second filter, and summing the magnified sample values to obtain a first sum value $S_x$, further comprising:
   setting part or all of $X_1, \ldots, X_n$ to equal to a first specified value, wherein the first specified value is any one of $X_1, \ldots, X_n$, or the first specified value is an average value of $X_1, \ldots, X_n$ or a weighted value of $X_1, \ldots, X_n$.

4. The method according to claim 2, before the step of magnifying the output values $(Y_1, \ldots, Y_m)$ according to each corresponding magnification factor $(d_1, \ldots, d_m)$ of the second filter, and summing the magnified output values $(Y_1, \ldots, Y_m)$ to obtain a second sum value $S_y$, further comprising:
   setting part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

5. A device for switching filters, comprising:
   a detecting component configured to detect whether or not a frequency range of an input signal is changed from a first frequency range into a second frequency range, wherein the first frequency range is a frequency range within which a first filter is able to work, and the second frequency range is a frequency range within which a second filter is able to work;
   n input branches of the first filter configured to receive a sample value of the input signal at a current moment and sample values of the input signal at n moments before the current moment to the first filter in an order of n moments before the current moment and at the current moment;
   one or more delayers in the n input branches of the first filter configured to receive the sample value of the input signal at the current moment and the sample values of the input signal at the n moments before the current moment;
   one or more switches configured to switch from the first filter to the second filter when the frequency range of the input signal is changed from the first frequency range into the second frequency range at the current moment to push, upon detection that the frequency range of the input signal is changed from the first frequency range into the second frequency range, the sample values of the input signal at the n moments before the current moment and the sample value of the input signal at the current moment from the one or more delayers in the n input branches of the first filter to n delay-amplifier branches of the second filter; and
   an output value obtaining component configured to take output values of the first filter at m moments before the current moment as output values of the second filter at the m moments, to obtain an output value of the second filter at the current moment using the output values of first filter at the m moments, the sample value of the input signal at the current moment, and the sample values of the input signal at the n moments, wherein n and m are both positive integers.

6. The device according to claim 5, wherein the output value obtaining component is configured to set the sample value of the input signal received by the second filter at the current moment and the sample values of the input signal received by the second filter at the n moments before the current moment as ($X_0, X_1, \ldots, X_n$), magnify the sample values ($X_0, X_1, \ldots, X_n$) according to each corresponding magnification factor ($c_0, c_1, \ldots, c_n$) of the second filter, and sum the magnified sample values to obtain a first sum value $S_x$; then set the output values of the second filter at the m moments before the current moment as output values ($Y_1, \ldots, Y_m$) of the first filter at the m moments, magnify the output values ($Y_1, \ldots, Y_m$) according to each corresponding magnification factor ($d_1, \ldots, d_m$) of the second filter, and sum the magnified output values to obtain a second sum value $S_y$; and add the first sum value $S_x$ and the second sum value $S_y$ to obtain the output value $Y'=S_x+S_y$ of the second filter at the current moment.

7. The device according to claim 6, the device further comprising a first value setting component, wherein the first value setting component is configured to set part or all of $X_1, \ldots, X_n$ to equal to a first specified value, wherein the first specified value is any one of $X_1, \ldots, X_n$, or the first specified value is an average value of $X_1, \ldots, X_n$ or a weighted value of $X_1, \ldots, X_n$.

8. The device according to claim 6, the device further comprising a second value setting component, wherein the second value setting component is configured to set part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

9. A medical detecting apparatus, wherein the medical detecting apparatus comprises:

a detecting component configured to detect whether or not a frequency range of an input signal is changed from a first frequency range into a second frequency range, wherein the first frequency range is a frequency range within which a first filter is able to work, and the second frequency range is a frequency range within which a second filter is able to work;

n input branches of the first filter configured to receive a sample value of the input signal at a current moment and sample values of the input signal at n moments before the current moment to the first filter in an order of n moments before the current moment and at the current moment;

one or more delayers in the n input branches of the first filter configured to receive the sample value of the input signal at the current moment and the sample values of the input signal at the n moments before the current moment;

one or more switches configured to switch from the first filter to the second filter when the frequency range of the input signal is changed from the first frequency range into the second frequency range at the current moment to push, upon detection that the frequency range of the input signal is changed from the first frequency range into the second frequency range, the sample values of the input signal at the n moments before the current moment and the sample value of the input signal at the current moment from the one or more delayers in the n input branches of the first filter to n delay-amplifier branches of the second filter; and an output value obtaining component configured to take output values of the first filter at m moments before the current moment as output values of the second filter at the m moments, to obtain an output value of the second filter at the current moment using the output values of first filter at the m moments, the sample value of the input signal at the current moment, and the sample values of the input signal at the n moments, wherein n and m are both positive integers.

10. The medical detecting apparatus according to claim 9, wherein the output value obtaining component is configured to set the sample value of the input signal received by the second filter at the current moment and the sample values of the input signal received by the second filter at the n moments before the current moment as sample values ($X_0, X_1, \ldots, X_n$), magnify the sample values ($X_0, X_1, \ldots, X_n$) according to each corresponding magnification factor ($c_0, c_1, \ldots, c_n$) of the second filter, and sum the magnified sample values to obtain a first sum value $S_x$; then set the output values of the second filter at the m moments before the current moment as output values ($Y_1, \ldots, Y_m$) of the first filter at the m moments, magnify the output values ($Y_1, \ldots, Y_m$) according to each corresponding magnification factor ($d_1, \ldots, d_m$) of the second filter, and sum the magnified output values to obtain a second sum value $S_y$; and add the first sum value $S_x$ and the second sum value $S_y$ to obtain the output value $Y'=S_x+S_y$ of the second filter at the current moment.

11. The medical detecting apparatus according to claim 10, the medical detecting apparatus further comprising a first value setting component, wherein the first value setting component is configured to set part or all of $X_1, \ldots, X_n$ to equal to a first specified value, wherein the first specified value is any one of $X_1, \ldots, X_n$, or the first specified value is an average of $X_1, \ldots, X_n$ or a weighted value of $X_1, \ldots, X_n$.

12. The medical detecting apparatus according to claim 10, the medical detecting apparatus further comprising a second value setting component, wherein the second value setting component is configured to set part or all of $Y_1, \ldots, Y_m$ to equal to a second specified value, wherein the second specified value is any one of $Y_1, \ldots, Y_m$, or the second specified value is an average value of $Y_1, \ldots, Y_m$ or a weighted value of $Y_1, \ldots, Y_m$.

* * * * *